US009071207B2

(12) United States Patent
Bai

(10) Patent No.: US 9,071,207 B2
(45) Date of Patent: Jun. 30, 2015

(54) PREDISTORTION OF CONCURRENT MULTI-BAND SIGNAL TO COMPENSATE FOR PA NON-LINEARITY

(75) Inventor: Chunlong Bai, Kanata, CA (US)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 518 days.

(21) Appl. No.: 13/365,356

(22) Filed: Feb. 3, 2012

(65) Prior Publication Data

US 2013/0200950 A1  Aug. 8, 2013

(51) Int. Cl.
*H04B 7/04* (2006.01)
*H03F 1/32* (2006.01)
(Continued)

(52) U.S. Cl.
CPC ............ *H03F 1/3247* (2013.01); *H03F 1/3258* (2013.01); *H03F 3/195* (2013.01); *H03F 3/245* (2013.01)

(58) Field of Classification Search
CPC .......... H04B 1/02; H04B 1/04; H04B 1/0475; H04B 15/00; H03F 1/26; H03F 1/3241; H04K 1/02; H04L 25/03; H04L 25/08; H04L 25/49; H04L 27/04; H04L 27/28
USPC ................... 330/10, 136, 149, 151; 370/208; 375/267, 275, 284–285, 295–297, 346; 455/63.1, 67.13, 103–105, 455/114.1–114.3
See application file for complete search history.

(56) References Cited

U.S. PATENT DOCUMENTS

| 6,549,067 B1 | 4/2003 | Kenington |
| 6,999,523 B2 | 2/2006 | Posti |
| 7,142,615 B2 * | 11/2006 | Hongo et al. ................. 375/297 |

(Continued)

FOREIGN PATENT DOCUMENTS

| EP | 1732208 A1 | 12/2006 |
| WO | 2013046183 A1 | 4/2013 |

OTHER PUBLICATIONS

Cidronali, A. et al., "A New Approach for Concurrent Dual-band IF Digital PreDistortion: System Design and Analysis," Workshop on Integrated Nonlinear Microwave and Millimetre-Wave Circuits, IEEE, Nov. 2008, Malaga, Spain, 4 pages.

(Continued)

*Primary Examiner* — Syed Haider
*Assistant Examiner* — Shawkat M Ali
(74) *Attorney, Agent, or Firm* — Withrow & Terranova, PLLC

(57) ABSTRACT

Systems and methods are disclosed for effecting predistortion of a concurrent multi-band signal to compensate for power amplifier non-linearity. In general, the concurrent multi-band signal contains frequency components occupying multiple frequency bands with no frequency components between adjacent frequency bands. In one embodiment, a transmitter includes a power amplifier that amplifies a modulated concurrent multi-band signal to provide an amplified concurrent multi-band signal. A predistortion sub-system effects predistortion of the modulated concurrent multi-band signal prior to amplification in order to compensate for non-linearity of the power amplifier. The predistortion sub-system includes a number of predistorters each providing predistortion for a different one of the frequency bands of the modulated concurrent multi-band signal. At least one of the predistorters provides predistortion for the corresponding frequency band of the modulated concurrent multi-band signal based on carrier frequency information for the modulated concurrent multi-band signal.

17 Claims, 4 Drawing Sheets

(51) Int. Cl.
*H03F 3/195* (2006.01)
*H03F 3/24* (2006.01)

(56) References Cited

U.S. PATENT DOCUMENTS

| | | | |
|---|---|---|---|
| 7,170,344 B2 | 1/2007 | Suzuki et al. | |
| 7,183,847 B2 | 2/2007 | Suzuki et al. | |
| 7,539,464 B2 | 5/2009 | Suzuki et al. | |
| 7,634,238 B2 | 12/2009 | Suzuki et al. | |
| 8,380,144 B1 | 2/2013 | Bai et al. | |
| 8,391,809 B1* | 3/2013 | Fuller | 455/114.3 |
| 2005/0009479 A1* | 1/2005 | Braithwaite | 455/114.3 |
| 2005/0068102 A1* | 3/2005 | Hongo et al. | 330/149 |
| 2006/0012426 A1* | 1/2006 | Nezami | 330/149 |
| 2006/0276147 A1* | 12/2006 | Suzuki et al. | 455/114.3 |
| 2008/0197925 A1* | 8/2008 | Furuta et al. | 330/149 |
| 2009/0129257 A1* | 5/2009 | Maltsev et al. | 370/208 |
| 2010/0098191 A1 | 4/2010 | Morris et al. | |
| 2010/0184392 A1* | 7/2010 | Largey et al. | 455/115.2 |
| 2010/0271957 A1 | 10/2010 | Stapleton et al. | |
| 2010/0316157 A1 | 12/2010 | Bassam et al. | |
| 2011/0064171 A1* | 3/2011 | Huang et al. | 375/346 |
| 2011/0092173 A1* | 4/2011 | Mccallister et al. | 455/108 |
| 2011/0210789 A1* | 9/2011 | Ohkawara et al. | 330/149 |
| 2012/0069931 A1 | 3/2012 | Gandhi et al. | |
| 2012/0154038 A1* | 6/2012 | Kim et al. | 330/149 |
| 2013/0064325 A1* | 3/2013 | Kilambi et al. | 375/297 |
| 2013/0094610 A1* | 4/2013 | Ghannouchi et al. | 375/296 |

OTHER PUBLICATIONS

Cidronali, A., "Dual-Band Power Amplifiers for WiMAX and WCDMA Applications," Target Day Programme 2007, Florence, Italy, Dec. 17, 2007, 51 pages.

Choi, Heung-Jae et al., "Dual-Band Predistortion Power Amplifier for Digital Cellular and IMT-2000 Base-station Application," Asia-Pacific Microwave Conference Proceedings, vol. 1, IEEE, Dec. 4-7, 2005, Suzhou, China, 4 pages.

Notice of Allowance for U.S. Appl. No. 13/249,319 mailed Nov. 9, 2012, 8 pages.

* cited by examiner

PREDISTORTION OF CONCURRENT MULTI-BAND SIGNAL TO COMPENSATE FOR PA NON-LINEARITY

FIELD OF THE DISCLOSURE

The present disclosure relates to a pre-distortion sub-system that effects predistortion of a concurrent multi-band signal to compensate for power amplifier non-linearity in a transmitter.

BACKGROUND

A radio system generally includes a transmitter that transmits information-carrying signals to a receiver. The transmitter includes a power amplifier that operates to amplify the signal to be transmitted to a power level that is sufficient to enable receipt of the signal by the receiver. The power amplifier is an active radio frequency sub-system. As such, it is desirable for the power amplifier sub-system to simultaneously achieve both high efficiency and high linearity. However in many applications such as, for example, wireless base station applications, designing power amplifier sub-systems that achieve both high efficiency and high linearity is especially challenging due to high peak to average ratio of the signal due to the use of advanced modulation schemes (e.g., high order Quadrature Amplitude Modulation (QAM), Orthogonal Frequency Division Multiplexing (OFDM), and Code Division Multiple Access (CDMA)) used in current and future wireless communication system standards and the strict requirements on out-of-band emissions imposed by current and future wireless communication system standards.

Adaptive digital predistortion to compensate for the non-linearity of the power amplifier is a proven technology that enables high linearity, high efficiency power amplifier sub-systems. Adaptive digital predistortion requires a feedback path to provide a feedback signal from the output of the power amplifier in order to close the adaptation loop. It is desirable to design the feedback path with minimum cost in terms of hardware and power consumption. However, the predistorted signal exhibits bandwidth expansion on the same order as the distorted signal without predistortion. For instance, if third-order intermodulation distortion (IM3) is the primary distortion to be counteracted, the predistorted signal occupies three times the bandwidth of the original, or input, signal prior to predistortion. Similarly, if fifth-order intermodulation distortion (IM5) is significant and is desired to be counteracted, the predistorted signal occupies five times the bandwidth of the original, or input, signal prior to predistortion. Still further, if higher order intermodulation distortion is desired to be counteracted, the predistorted signal occupies even greater bandwidth.

As the bandwidth of the original, or input, signal prior to predistortion increases, a sampling rate needed to process the predistorted signal approaches or exceeds a clock rate limit that current Integrated Circuit (IC) technology can support. Generally, there are two approaches to address this issue. The first approach is to apply signal processing techniques to support a sampling rate that is higher than the IC clock rate. The second approach is to seek technologies that reduce the required sampling rate. Regarding this second approach, there is a need for systems and methods for reducing the required sampling rate for processing the predistorted signal.

The required sampling rate is further increased when using conventional architectures for single-band signals for concurrent multi-band signals. Particularly, if a multi-band signal is treated as a single-band signal with a wide bandwidth, then the required sampling rate for the predistorted signal quickly approaches or exceeds the clock rate limit of current IC technology. As such, there is need for reducing the required sampling rate for processing the predistorted signal for a concurrent multi-band system.

SUMMARY

Systems and methods are disclosed for effecting predistortion of a concurrent multi-band signal to compensate for power amplifier non-linearity. In general, the concurrent multi-band signal contains frequency components occupying multiple frequency bands (i.e., a first continuous frequency band, a second continuous frequency band, etc.) with no frequency components between adjacent frequency bands. In one embodiment, a transmitter includes a power amplifier that amplifies a modulated concurrent multi-band signal to provide an amplified concurrent multi-band signal. A predistortion sub-system effects predistortion of the modulated concurrent multi-band signal prior to amplification in order to compensate for non-linearity of the power amplifier. The predistortion sub-system includes a number of predistorters each providing predistortion for a different one of the frequency bands of the modulated concurrent multi-band signal. At least one of the predistorters provides predistortion for the corresponding frequency band of the modulated concurrent multi-band signal based on carrier frequency information for the modulated concurrent multi-band signal.

By using separate predistorters for the frequency bands of the modulated concurrent multi-band signal rather than a single predistorter for an entire bandwidth of the concurrent multi-band signal, a sampling rate for the predistortion sub-system can be substantially reduced. Further, by providing at least a portion of the predistortion based on the carrier frequency information for the modulated carrier frequency information, the predistortion sub-system is enabled to provide predistortion for frequency components that vary depending on actual values of carrier frequencies of the modulated concurrent multi-band signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to digital predistortion to compensate for power amplifier non-linearity for a concurrent multi-band signal. In general, the concurrent multi-band signal contains frequency components occupying multiple frequency bands (i.e., a first continuous frequency band, a second continuous frequency band, etc.) with no frequency components between adjacent frequency bands. In one embodiment, the concurrent multi-band signal includes two frequency bands and, as such, is also referred to herein as a concurrent dual-band signal. However, for reasons discussed below, in the preferred embodiment, the concurrent multi-band signal includes three or more frequency bands.

For each frequency band of the concurrent multi-band signal, a center frequency of the frequency band is referred to herein as a carrier frequency of the concurrent multi-band signal. As such, the concurrent multi-band signal as defined herein includes multiple carrier frequencies. Frequency differences between adjacent carrier frequencies of the concurrent multi-band signal are referred to herein as carrier frequency spacings. A ratio of the carrier frequency spacing over a maximum individual baseband bandwidth (i.e., the maximum individual baseband bandwidth is a maximum bandwidth among the baseband signals that correspond to the frequency bands of the concurrent multi-band signal) is high such that a distortion or predistortion surrounding each of the carrier frequencies also occupies disjoint frequency bands. In other words, the distortion or predistortion centered at each of the carrier frequencies is separable. Some examples of situations or applications where such concurrent multi-band signals are used include multi-standard systems where each standard occupies a different frequency band, systems that transmit signals for multiple standards simultaneously, and systems having concurrent transmissions in multiple bands for the same standard.

Figure 1:
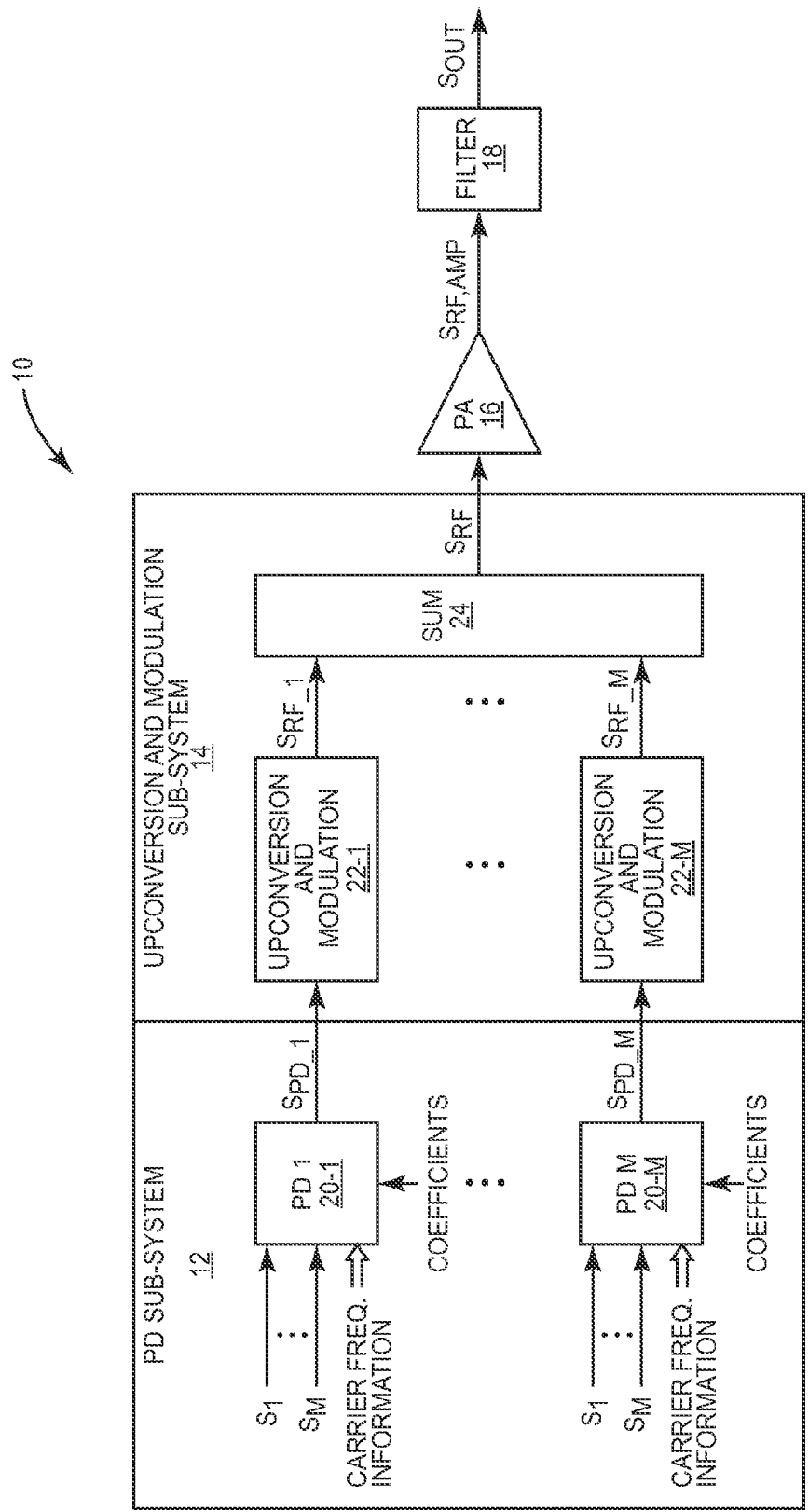
FIG. 1 illustrates a concurrent multi-band transmitter including digital predistortion to compensate for power amplifier non-linearity according to one embodiment of the present disclosure.

FIG. 1 illustrates a wireless transmitter 10 that provides predistortion for a concurrent multi-band signal according to one embodiment of the present disclosure. It should be noted that the wireless transmitter 10 is exemplary and is not intended to limit the scope of the present disclosure. The concepts disclosed herein related to predistortion for a concurrent multi-band signal are not limited to use in the particular embodiment of the wireless transmitter 10 illustrated in FIG. 1 and can be used in any suitable system in which predistortion for a concurrent multi-band signal is desired. Further, while the transmitter 10 is a wireless transmitter, the concepts disclosed herein are also applicable to wired transmitters.

As illustrated in FIG. 1, the wireless transmitter 10 includes a predistortion (PD) sub-system 12, an upconversion and modulation sub-system 14, a power amplifier (PA) 16, and a filter 18 connected as shown. The predistortion sub-system 12 generally operates to compensate for, or counteract, non-linearity of the power amplifier 16. In doing so, the predistortion sub-system 12 compensates for up to a desired maximum intermodulation distortion order (e.g., third-order intermodulation distortion (IM3), fifth-order intermodulation distortion (IM5), or the like).

As illustrated, the predistortion sub-system 12 includes a number of predistorters 20-1 through 20-M (generally referred to herein collectively as predistorters 20 and individually as predistorter 20). The predistorters 20 may be implemented in hardware, software, or a combination thereof. For example, the predistorters 20 may be implemented using one or more Application Specific Integrated Circuits (ASICs), one or more Digital Signal Processors (DSPs), or the like. The number of predistorters 20-1 through 20-M is equal to the number (M) of frequency bands in the concurrent multi-band signal, and each of the predistorters 20-1 through 20-M provides predistortion for a different one of the frequency bands of the concurrent multi-band signal. So, for example, the predistorter 20-1 provides predistortion for a first frequency band of the concurrent multi-band signal, the predistorter 20-2 (not shown) provides predistortion for a second frequency band of the concurrent multi-band signal, etc. In other words, the predistortion sub-system 12 includes a separate predistorter 20 for each of the frequency bands of the concurrent multi-band signal.

The predistorters 20-1 through 20-M receive baseband input signals ($S_1$ through $S_M$) for the frequency bands of the concurrent multi-band signal and carrier frequency information that includes or is related to the carrier frequencies for the concurrent multi-band signal and generate predistorted baseband signals ($Sp_{D\_1}$ through $S_{PD\_M}$) for the corresponding frequency bands of the concurrent multi-band signal. Thus, for example, the predistorter 20-1 receives the baseband input signals ($S_1$ through $S_M$) and the carrier frequency information and processes the baseband input signals ($S_1$ through $S_M$) and the carrier frequency information to generate the predistorted baseband signal ($S_{PD\_1}$) for a first frequency band of the concurrent multi-band signal. As discussed below in detail, the carrier frequency information is used to configure the predistorter 20-1 and generate the predistorted baseband signal ($S_{PD\_1}$). The carrier frequency information includes values of the carrier frequencies of the concurrent multi-band signal and/or values derived from the values of the carrier frequencies of the concurrent multi-band signals needed for predistortion. The remaining predistorters 20 operate in a similar manner.

The upconversion and modulation sub-system 14 includes a number (M) of upconversion and modulation circuits 22-1 through 22-M (generally referred to herein collectively as upconversion and modulation circuits 22 and individually as upconversion and modulation circuit 22) and a summation circuit 24 connected as shown. The upconversion and modulation circuits 22-1 through 22-M receive the corresponding predistorted baseband signals ($S_{PD\_1}$ through $S_{PD\_M}$) and perform upconversion and modulation to output predistorted radio frequency signals ($S_{RF\_1}$ through $S_{RF\_M}$) for the corresponding frequency bands of the concurrent multi-band signal. The summation circuit 24 then sums, or combines, the predistorted radio frequency signals ($S_{RF\_1}$ through $S_{RF\_M}$) to provide a predistorted radio frequency signal ($S_{RF}$). Notably, the predistorted radio frequency signal ($S_{RF}$) is a concurrent multi-band signal and is referred to herein as a modulated concurrent multi-band signal. The predistorted radio frequency signal ($S_{RF}$) is amplified by the power amplifier (PA) 16 to provide an amplified radio frequency signal ($S_{RF,AMP}$), which is also a concurrent multi-band signal and is referred to herein as an amplified concurrent multi-band signal. The predistortion applied by the predistortion sub-system 12 compensates for, or counter-acts, the non-linearity of the power amplifier 16. The amplified radio frequency signal ($S_{RF,AMP}$) is then filtered by the filter 18 to provide an output signal ($S_{OUT}$) of the wireless transmitter 10. The output signal ($S_{OUT}$) is the concurrent multi-band signal represented at baseband by the baseband input signals ($S_1$ through $S_M$).

Figure 2:
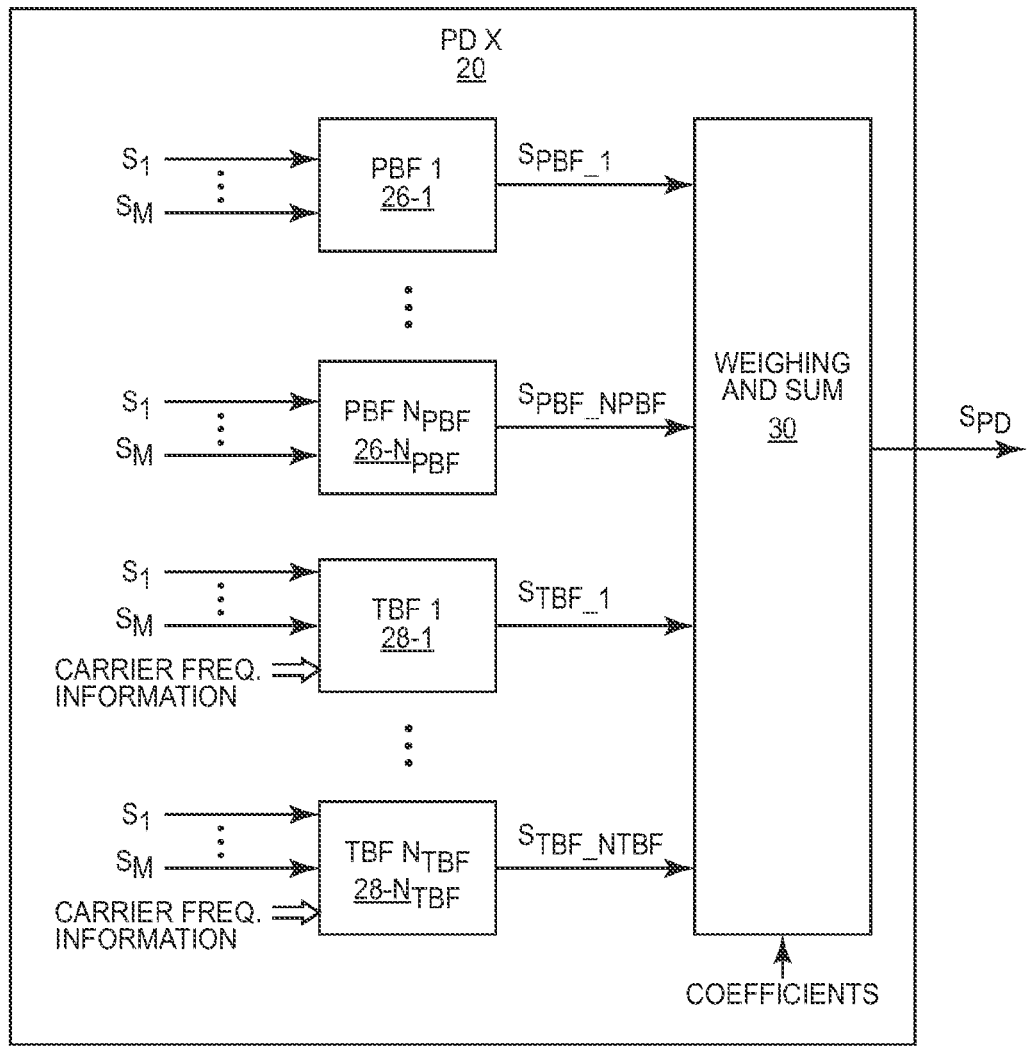
FIG. 2 illustrates one of the separate predistorters of the predistortion sub-system of FIG. 1 where the predistorter includes or implements a number of permanent basis functions and a number of temporary basis functions according to one embodiment of the present disclosure.

FIG. 2 is a block diagram that illustrates one of the predistorters 20 of FIG. 1 in more detail according to one embodiment of the present disclosure. Note that this discussion is equally applicable to all of the predistorters 20 of FIG. 1. The predistorter 20 provides the predistortion for one frequency band (i.e., for one carrier frequency) of the concurrent multi-band signal. As illustrated, the predistorter 20 includes a number of permanent basis functions (PBFs) 26-1 through 26-$N_{PBF}$ (generally referred to herein collectively as permanent basis functions 26 and individually as permanent basis function 26) and a number of temporary basis functions (TBFs) 28-1 through 28-$N_{TBF}$ (generally referred to herein collectively as temporary basis functions 28 and individually as temporary basis function 28). As used herein, the permanent basis functions 26-1 through 26-$N_{PBF}$ are basis functions that are not a function of the carrier frequency information for the concurrent multi-band signal. Particularly, the permanent basis functions 26-1 through 26-$N_{PBF}$ are the same for a particular system setup (i.e., maximum intermodulation distortion order and number of frequency bands in the concurrent multi-band signal) regardless of the values of the carrier frequencies of the concurrent multi-band signal. In contrast, the temporary basis functions 28-1 through 28-$N_{TBF}$ are a function of the system setup and the carrier frequencies of the concurrent multi-band signal. More specifically, as discussed below, depending on the particular carrier frequency values for the concurrent multi-band signal, there may be aliasing of undesired frequency components into the frequency bands of the concurrent multi-band signal. The temporary basis functions 28-1 through 28-$N_{TBF}$ are configured to compensate for these undesired frequency components.

The permanent basis functions 26-1 through 26-$N_{PBF}$ process the baseband input signals ($S_1$ through $S_M$) to generate corresponding permanent basis function output signals ($S_{PBF\_1}$ through $S_{PBF\_NPBF}$). The temporary basis functions 28-1 through 28-$N_{TBF}$ process the baseband input signals ($S_1$ through $S_M$) and the carrier frequency information for the concurrent multi-band signal to generate corresponding temporary basis function output signals ($S_{TBF\_1}$ through $S_{TBF\_NTBF}$). A weighting and sum function 30 then weights the permanent and temporary basis function output signals ($S_{PBF\_1}$ through $S_{PBF\_NPBF}$ and $S_{TBF\_1}$ through $S_{TBF\_NTBF}$) according to corresponding coefficients input to the weighting and sum function 30 and sums the weighted permanent and temporary basis function output signals ($S_{PBF\_1}$ through $S_{PBF\_NPBF}$ and $S_{TBF\_1}$ through $S_{TBF\_NTBF}$) to output a predistorted baseband signal ($S_{PD}$) from the predistorter 20. Notably, the coefficients are provided by a predistortion adaptor (not shown) that adaptively configures the coefficients based on a feedback signal from the output of the power amplifier 16 in order to accurately compensate for the non-linearity of the power amplifier 16, which changes over time, temperature, and/or the like. Before proceeding, it should be noted that, depending on the particular carrier frequencies, some of the predistorters 20 may be configured to include only permanent basis functions 26 and, as such, the carrier frequency information may not be used when generating the corresponding predistorted baseband signals for all of the predistorters 20.

Figure 3:
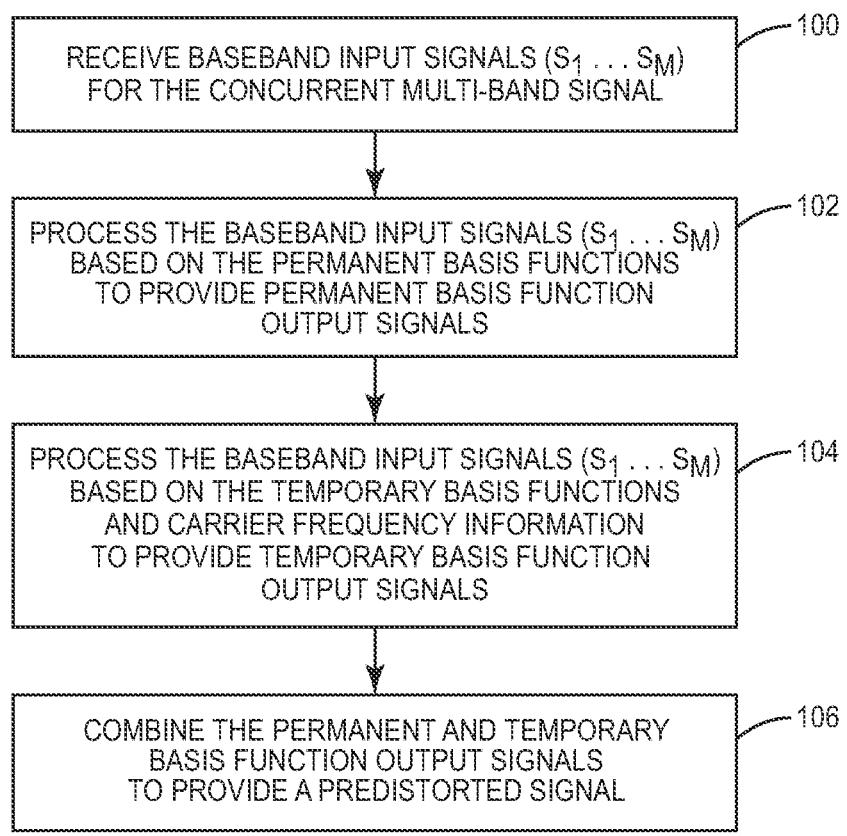
FIG. 3 is a flow chart that illustrates the operation of the predistortion sub-system of FIGS. 1 and 2 according to one embodiment of the present disclosure.

FIG. 3 is a flow chart that illustrates the operation of the predistorter 20 of FIGS. 1 and 2 according to one embodiment of the present disclosure. First, the predistorter 20 receives the baseband input signals ($S_1$ through $S_M$) for the concurrent multi-band signal (step 100). The predistorter 20 processes at least a subset of the baseband input signals ($S_1$ through $S_M$) using the permanent basis functions 26-1 through 26-$N_{PBF}$ to generate the permanent basis function output signals ($S_{PBF\_1}$ through $S_{PBF\_NPBF}$) (step 102). The predistorter 20 also processes at least a subset of the baseband input signals ($S_1$ through $S_M$) using the temporary basis functions 28-1 through 28-$N_{TBF}$ and the carrier frequency information for the concurrent multi-band signal to generate the temporary basis function output signals ($S_{TBF\_1}$ through $S_{TBF\_NTBF}$) (step 104). Note that steps 102 and 104 can be performed in any order (i.e., step 102 then step 104 or vice versa). The predistorter 20 then combines the permanent basis function output signals ($S_{PBF\_1}$ through $S_{PBF\_NPBF}$) and the temporary basis function output signals ($S_{TBF\_1}$ through $S_{TBF\_NTBF}$) to provide the predistorted signal ($S_{PD}$) (step 106).

Figure 4:
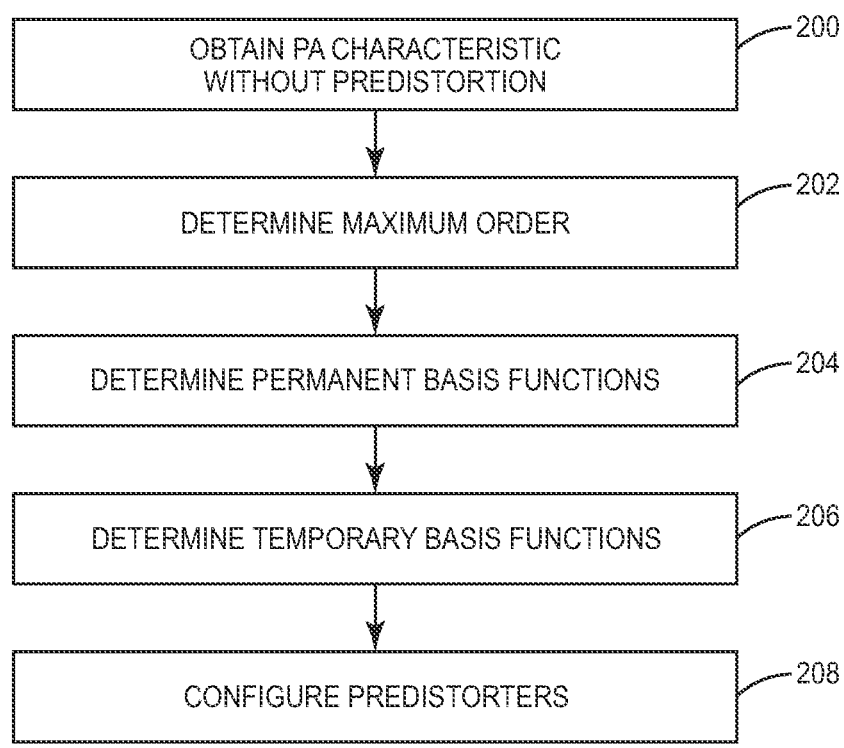
FIG. 4 is a flow chart that illustrates a process for configuring the predistorters of the predistortion sub-system of FIGS. 1 and 2 according to one embodiment of the present disclosure.

Thus far, the discussion has focused on the architecture and operation of the predistorters 20. FIG. 4 focuses on the configuration of the permanent basis functions 26 and the temporary basis functions 28 for the predistorters 20 for the frequency bands of the concurrent multi-band signal. More specifically, FIG. 4 illustrates a process for configuring the predistorters 20 according to one embodiment of the present disclosure. As illustrated, the configuration process begins by first obtaining a characteristic of the power amplifier 16 without predistortion (step 200). In this embodiment, the characteristic of the power amplifier 16 is bandwidth expansion of the output signal from the power amplifier 16 without predistortion.

Next, a maximum order for the permanent and temporary basis functions 26 and 28 is determined (step 202). The maximum order (2k+1) is a tradeoff between complexity and performance based on the characteristic of the power amplifier 16 determined in step 200. In one embodiment, a ratio of the bandwidth of the output of the power amplifier 16 over the bandwidth of the input of the power amplifier 16 serves as a basic input to determine the maximum order (2k+1) for the permanent and temporary basis functions 26 and 28. Using the single-band signal scenario as an example, if for example the maximum order (2k+1) is the third order, it should only be expected that the concatenation of the predistortion sub-system 12 and the power amplifier 16 achieve significant reduction of distortions within a bandwidth of three times the original bandwidth at the cost of an increase in distortions in the frequency range of $[f_c-(9/2)\text{bw}, f_c-(3/2)\text{bw}]$ and $[f_c+(3/2)\text{bw}, f_c+(9/2)\text{bw}]$, where $f_c$ is the carrier frequency of the single-band signal and bw is the original bandwidth. Again using the single-band scenario as an example, if for example the maximum order (2k+1) is the fifth order, it should only be expected that the concatenation of the predistortion sub-system 12 and the power amplifier 16 achieve significant reduction of distortions within a bandwidth of five times the original bandwidth at the cost of an increase in distortions in the frequency range of $[f_c-(25/2)\text{bw}, f_c-(5/2)\text{bw}]$ and $[f_c+(5/2)\text{bw}, f_c+(25/2)\text{bw}]$, where $f_c$ is the carrier frequency of the single-band signal and bw is the original bandwidth. Depending on the performance requirement for a particular application, an appropriate maximum order (2k+1) is selected.

Next, the permanent basis functions 26 are determined (step 204). As discussed below in detail, a mathematical expression of the modulated concurrent multi-band signal for each odd order up to the maximum order (2k+1) is expanded into a summation of a number of terms. In the preferred embodiment, for each odd order starting with the third order up to the maximum order (2k+1), a corresponding mathematical expression of the modulated concurrent multi-band signal for that order is expanded into a summation of a number of terms. An exhaustive search of the terms for each of these orders is performed to identify terms that have a center frequency that corresponds to (i.e., is equal to) any one of the carrier frequencies of the concurrent multi-band signal. In other words, the identified terms have center frequencies that are always equal to one of the carrier frequencies of the concurrent multi-band signal regardless of the actual values of the carrier frequencies of the concurrent multi-band signal. Baseband representations of the identified terms are then utilized as the permanent basis functions 26 for the predistorters 20 of corresponding frequency bands of the concurrent multi-band signal.

In addition to determining permanent basis functions 26 for the predistorters 20, the temporary basis functions 28 for the predistorters 20 are determined (step 206). As discussed below in detail, a mathematical expression of the modulated concurrent multi-band signal for each even and odd order up to the maximum order (2k+1) is expanded into a summation of a number of terms. In the preferred embodiment, for each even and odd order starting with the second order up to the maximum order (2k+1), a corresponding mathematical expression of the modulated concurrent multi-band signal for that order is expanded into a summation of a number of terms. Based on the values of the carrier frequencies of the concurrent multi-band signal, an exhaustive search of the terms for each of these orders is performed to identify terms that have frequency spans that overlap a maximum frequency span of distortion by the permanent basis functions 26 for any of the frequency bands of the concurrent multi-band signal. Baseband representations of the identified terms are then utilized as the temporary basis functions 28 for the predistorters 20 of the corresponding frequency bands. Note that the temporary basis functions 28 depend on the actual values of the carrier frequencies of the concurrent multi-band signal. In contrast, the permanent basis functions 26 do not depend on the actual values of the carrier frequencies of the concurrent multi-band signal.

Once the permanent and temporary basis functions 26 and 28 are determined, the predistorters 20 are configured (step 208). Specifically, the predistorters 20 are configured with the permanent basis functions 26 and the temporary basis functions 28 for the corresponding frequency bands of the concurrent multi-band signal. It should be noted that the process of FIG. 4 may be performed completely or partially by a controller associated with the predistortion sub-system 12. The controller may be internal to the wireless transmitter 10 in which case the configuration process of FIG. 4, or potentially just steps 204 through 208, may be performed dynamically as need. For instance, the process of FIG. 4 or steps 204 through 208 may be performed in response to changes in the carrier frequencies of the concurrent multi-band signal. Alternatively, the controller may be external to the wireless transmitter 10. For example, the process of FIG. 4 may be performed during design and/or manufacturing of the wireless transmitter 10, and the controller may be an external controller utilized during the design and/or manufacturing process.

The process of FIG. 4 will now be described for two different scenarios, namely: (1) a concurrent dual-band signal and third-order scenario and (2) a concurrent tri-band signal and third-order scenario. Then, a generalized process for any multi-band signal and any maximum order is described.

Dual-band, Third Order: Initially, some notations are defined as follows.
  $S_1$: Band 1 (A) baseband signal;
  $S_2$: Band 2 (B) baseband signal;
  w1: $=2\pi f_{c1}$; $f_{c1}$ is the carrier frequency for band 1 (A);
  w2: $=2\pi f_{c2}$; $f_{c2}$ is the carrier frequency for band 2 (B);
  Re{.}: Real part of the argument; and
  (.)*: Complex conjugate.

Also, some basic equalities used in the analysis below are:

$$Re\{a\}=(a+a^*)/2 \qquad (1)$$

$$(ab)^*=(a^*)(b^*) \qquad (2)$$

$$a \cdot a^* = |a|^2 \qquad (3)$$

The radio frequency dual-band signal can be expressed as:

$$Re\{S_1 \cdot e^{j(w1)t}\} + Re\{S_2 \cdot e^{j(w2)t}\}. \qquad (4)$$

The output of a third-order non-linear function $f_{NL}(x)=x^3$ excited by this dual-band signal is:

$$(Re\{S_1 \cdot e^{j(w1)t}\} + Re\{S_2 \cdot e^{j(w2)t}\})^3. \qquad (5)$$

Of interest is the expression for the frequency components that fall into frequency band A centered at $f_{c1}$, frequency band B centered at $f_{c2}$, frequency band 2A-B centered at $2f_{c1}-f_{c2}$, and frequency band 2B-A centered at $2f_{c2}-f_{c1}$.

First, the expression in Equation (3) is expanded to identify the expression for the signals in frequency bands A, B, 2A-B, and 2B-A. The basic expansion is in the form $(a+b)^3=a^3+3a^2b+3ab^2+b^3$. More specifically, the expansion is as follows:

$$(Re\{S_1 \cdot e^{j(w1)t}\} + Re\{S_2 \cdot e^{j(w2)t}\})^3 = (Re\{S_1 \cdot e^{j(w1)t}\})^3 + \qquad (6)$$

$$3(Re\{S_1 \cdot e^{j(w1)t}\})^2(Re\{S_2 \cdot e^{j(w2)t}\}) + \qquad (7)$$

$$3(Re\{S_1 \cdot e^{j(w1)t}\})(Re\{S_2 \cdot e^{j(w2)t}\})^2 + \qquad (8)$$

$$(Re\{S_2 \cdot e^{j(w2)t}\})^3. \qquad (9)$$

Next, each of the four terms expressed in (6) through (9) are expanded. More specifically, term (6) can be expanded as:

$$(Re\{S_1 \cdot e^{j(w1)t}\})^3 = \frac{1}{8}(S_1 \cdot e^{j(w1)t} + S_1^* \cdot e^{j(-w1)t})^3 \qquad (10)$$

$$= \frac{1}{8}((S_1 \cdot e^{j(w1)t})^3 + 3(S_1 \cdot e^{j(w1)t})^2(S_1^* \cdot e^{j(-w1)t}) +$$

$$3(S_1 \cdot e^{j(w1)t})(S_1^* \cdot e^{j(-w1)t})^2 + (S_1^* \cdot e^{j(-w1)t})^3)$$

$$= \frac{1}{8}(S_1^3 \cdot e^{j(3w1)t} + 3S_1|S_1|^2 \cdot e^{j(w1)t} + 3S_1^*|S_1| \cdot$$

$$e^{j(-w1)t} + (S_1^*)^3 \cdot e^{j(-3w1)t}).$$

Term (7) can be expanded as:

$$3(Re\{S_1 \cdot e^{j(w1)t}\})^2(Re\{S_2 \cdot e^{j(w2)t}\}) = \qquad (11)$$

$$\frac{3}{8}(S_1 \cdot e^{j(w1)t} + S_1^* \cdot e^{j(-w1)t})^2(S_2 \cdot e^{j(w2)t} + S_2^* \cdot e^{j(-w2)t}) =$$

$$\frac{3}{8}(S_1^2 \cdot e^{j(2w1)t} + 2|S_1|^2 + (S_1^2)^* \cdot e^{j(-2w1)t})(S_2 \cdot e^{j(w2)t} + S_2^* \cdot e^{j(-w2)t}) =$$

-continued $$\frac{1}{8}(3S_1^2S_2 \cdot e^{j(2w1+w2)t} + 6|S_1|^2S_2 \cdot e^{j(w2)t} +$$
$$3(S_1^2)^*S_2 \cdot e^{j(-2w1+w2)t} + 3S_1^2S_2^* \cdot e^{j(2w1-w2)t} +$$
$$6|S_1|^2S_2^* \cdot e^{j(-w2)t} + 3(S_1^2S_2)^* \cdot e^{j(-2w1-w2)t}).$$

Term (8) can be expanded as:

$$3(Re\{S_1 \cdot e^{j(w1)t}\})(Re\{S_2 \cdot e^{j(w2)t}\})^2 = \quad (12)$$
$$\frac{3}{8}(S_1 \cdot e^{j(w1)t} + S_1^* \cdot e^{j(-w1)t})(S_2 \cdot e^{j(w2)t} + S_2^* \cdot e^{j(-w2)t})^2 =$$
$$\frac{3}{8}(S_1 \cdot e^{j(w1)t} + S_1^* \cdot e^{j(-w1)t})(S_2^2 \cdot e^{j(2w2)t} + 2|S_2|^2 + (S_2^2)^* \cdot e^{j(-2w2)t}) =$$
$$\frac{1}{8}(3S_1S_2^2 \cdot e^{j(w1+2w2)t} + 6S_1|S_2|^2 \cdot e^{j(w1)t} +$$
$$3S_1(S_2^2)^* \cdot e^{j(w1-2w2)t} + 3S_1^*S_2^2 \cdot e^{j(-w1+2w2)t} +$$
$$6S_1^*|S_2|^2 \cdot e^{j(-w1)t} + 3(S_1S_2^2)^* \cdot e^{j(-w1-2w2)t}).$$

Lastly, term (9) can be expanded as:

$$(Re\{S_2 \cdot e^{j(w2)t}\})^3 = \frac{1}{8}(S_2 \cdot e^{j(w2)t} + S_2^* \cdot e^{j(-w2)t})^3 \quad (13)$$
$$= \frac{1}{8}((S_2 \cdot e^{j(w2)t})^3 + 3(S_2 \cdot e^{j(w2)t})^2(S_2^* \cdot e^{j(-w2)t}) +$$
$$3(S_2 \cdot e^{j(w2)t})(S_2^* \cdot e^{j(-w2)t})^2 + (S_2^* \cdot e^{j(-w2)t})^3)$$
$$= \frac{1}{8}(S_2^3 \cdot e^{j(3w2)t} + 3S_2|S_2|^2 \cdot e^{j(w2)t} + 3S_2^*|S_2| \cdot$$
$$e^{j(-w2)t} + (S_2^*)^3 \cdot e^{j(-3w2)t}).$$

From Equation (10), it can be seen that the term $3S_1|S_1|^2 \cdot e^{j(w1)t}$ has a center frequency that is equal the center frequency (w1=$2\pi f_{c1}$) of frequency band A of the dual-band signal. From Equation (11), it can be seen that the term $6|S_1|^2S_2 \cdot e^{j(w2)t}$ has a center frequency equal to the center frequency (w2=$2\pi f_{c2}$) of frequency band B of the dual-band signal, and the term $3S_1^2S_2^* \cdot e^{j(2w1-w2)t}$ has a center frequency equal to the center frequency of frequency band 2A-B. From Equation (12), it can be seen that the term $6S_1|S_2|^2 \cdot e^{j(w1)t}$ has a center frequency equal to the center frequency (w1=$2\pi f_{c1}$) of frequency band A of the dual-band signal, and the term $3S_1^*S_2^2 \cdot e^{j(-w1+2w2)t}$ has a center frequency equal to the center frequency of frequency band 2B-A. Lastly, from Equation (13), it can be seen that the term $3S_2|S_2|^2 \cdot e^{j(w2)t}$ has a center frequency that is equal the center frequency (w2=$2\pi f_{c2}$) of frequency band A of the dual-band signal. Table 1 below summarizes these results.

TABLE 1

| Frequency Band | Terms |
|---|---|
| Band A (centered at $f_{c1}$) | $\frac{1}{8}(3S_1|S_1|^2 \cdot e^{j(w1)t} + 6S_1|S_2|^2 \cdot e^{j(w1)t}) = \frac{3}{8}(S_1|S_1|^2 + 2S_1|S_2|^2) \cdot e^{j(w1)t}$ |
| Band B (centered at $f_{c2}$) | $\frac{1}{8}(6S_2|S_1|^2 \cdot e^{j(w2)t} + 3S_2|S_2|^2 \cdot e^{j(w2)t}) = \frac{3}{8}(S_2|S_2|^2 + 2S_2|S_1|^2) \cdot e^{j(w2)t}$ |
| Band 2A-B (centered at $2f_{c1} - f_{c2}$) | $\frac{3}{8}(S_1^2S_2^* \cdot e^{j(2w1-w2)t})$ |
| Band 2B-A (centered at $2f_{c2} - f_{c1}$) | $\frac{3}{8}(S_1^*S_2^2 \cdot e^{j(-w1+2w2)t})$ |

The results shown in Table 1 show that the signals in all four frequency bands A, B, 2A-B, and 2B-A can be generated in baseband and then tuned to the center frequency of the individual bands. The baseband signals are as follows for bands A, B, C, and D:

$$\text{Band } A : S_1|S_1|^2 + 2S_1|S_2|^2 \quad (14)$$

$$\text{Band } B : S_2|S_2|^2 + 2S_2|S_1|^2 \quad (15)$$

$$\text{Band } 2A\text{-}B : S_1^2 S_2^* \quad (16)$$

$$\text{Band } 2B\text{-}A : S_1^* S_2^2. \quad (17)$$

Note that the common factor (3/8) is omitted from Equations (14) through (17). The baseband signals expressed in Equations (14) through (17) are only functions of the baseband signals in band A and band B (i.e., $S_1$ and $S_2$) and are not functions of the carrier frequencies. As such, for the dual-band scenario, only the permanent basis functions 26 are needed (i.e., there are no temporary basis functions 28). The terms identified for each frequency band correspond to the permanent basis functions 26 for the corresponding frequency bands, and Equations (14) through (17) represent the concatenation or combination of the permanent basis functions 26 for each frequency band.

For the dual-band case, when considering the distortions centered at the desired carrier frequencies $f_{c1}$ and $f_{c2}$ of the dual-band signal, although the number of bands of the distorted signals increases as the maximum order increases (e.g., increases to the fifth, seventh, or higher order), distortions centered in other bands, namely, those centered at $(k+1)f_{c1} - kf_{c2}$ and $(k+1)f_{c2} - kf_{c1}$ will never alias into the desired signal centered at $f_{c1}$ and $f_{c2}$ so long as: (1) the signals in the bands centered at $f_{c2}$ and $2f_{c1} - f_{c2}$ do not alias into the desired carrier frequency $f_{c1}$ and (2) the signals in the bands centered at $f_{c1}$ and $2f_{c2} - f_{c1}$ do not alias into the desired carrier frequency $f_{c2}$. As will be shown below, the same does not hold true for multi-band signals having three or more frequency bands.

Tri-Band, Third-Order: The following notations are used for this discussion:
  $S_1$: Band 1 (A) baseband signal;
  $S_2$: Band 2 (B) baseband signal;
  $S_3$: Band 3 (C) baseband signal;
  w1: =$2\pi f_{c1}$; $f_{c1}$ is the carrier frequency for band 1 (A);
  w2: =$2\pi f_{c2}$; $f_{c2}$ is the carrier frequency for band 2 (B);
  w3: =$2\pi f_{c3}$; $f_{c3}$ is the carrier frequency for band 3 (C);
  Re{.}: Real part of the argument; and
  (.)*: Complex conjugate.
The carrier frequencies are labeled such that: $f_{c1} < f_{c3} < f_{c2}$.
The radio frequency tri-band signal can be expressed as:

$$Re\{S_1 \cdot e^{j(w1)t}\} + Re\{S_2 \cdot e^{j(w2)t}\} + Re\{S_3 \cdot e^{j(w3)t}\}. \quad (18)$$

The output of a third-order non-linear function $f_{NL}(x) = x^3$ excited by this tri-band signal is:

$$(Re\{S_1 \cdot e^{j(w1)t}\} + Re\{S_2 \cdot e^{j(w2)t}\} + Re\{S_3 \cdot e^{j(w3)t}\})^3. \quad (19)$$

Generally, the bands of interest are in the positive frequency range and within the vicinity of the fundamentals of the signals in the bands of interest.

The expression in Equation (19) is expanded to identify the expression for the signals in frequency bands of interest. The basic expansion is in the form of:

$$(a+b+c)^3 = a^3 + b^3 + c^3 + \qquad (20)$$

$$3a^2b + 3ab^2 + 3a^2c + 3ac^2 + 3b^2c + 3bc^2 + \qquad (21)$$

$$6abc. \qquad (22)$$

From Equation (10) above, it follows that:

$(\text{Re}\{S_1 \cdot e^{j(w1)t}\})^3$ contributes the term $3S_1|S_1|^2 \cdot e^{j(w1)t}$ in frequency band A, $(\text{Re}\{S_2 \cdot e^{j(w2)t}\})^3$ contributes the term $3S_2|S_2|^2 \cdot e^{j(w2)t}$ in frequency band B, and $(\text{Re}\{S_3 \cdot e^{j(w3)t}\})^3$ contributes the term $3S_3|S_3|^2 \cdot e^{j(w3)t}$ in frequency band C. From Equation (11) above, it follows that:

$3(\text{Re}\{S_1 \cdot e^{j(w1)t}\})^2(\text{Re}\{S_2 \cdot e^{j(w2)t}\})$ contributes the term $6|S_1|^2 S_2 \cdot e^{j(w2)t}$ in frequency band B and the term $3S_1^2 S_2^* \cdot e^{j(2w1-w2)t}$ in frequency band 2A-B, $3(\text{Re}\{S_1 \cdot e^{j(w1)t}\})(\text{Re}\{S_2 \cdot e^{j(w2)t}\})^2$ contributes the term $6S_1|S_2|^2 \cdot e^{j(w1)t}$ in frequency band A and the term $3S_1^* S_2^2 \cdot e^{j(-w1+2w2)t}$ in frequency band 2B-A, $3(\text{Re}\{S_1 \cdot e^{j(w1)t}\})^2(\text{Re}\{S_3 \cdot e^{j(w3)t}\})$ contributes the term $6|S_1|^2 S_3 \cdot e^{j(w3)t}$ in frequency band C and the term $3S_1^2 S_3^* \cdot e^{j(2w1-w3)t}$ in frequency band 2A-C, $3(\text{Re}\{S_1 \cdot e^{j(w1)t}\})(\text{Re}\{S_3 \cdot e^{j(w3)t}\})^2$ contributes the term $6S_1|S_3|^2 \cdot e^{j(w1)t}$ in frequency band A and the term $3S_1^* S_3^2 \cdot e^{j(-w1+2w3)t}$ in frequency band 2C-A, $3(\text{Re}\{S_2 \cdot e^{j(w2)t}\})^2(\text{Re}\{S_3 \cdot e^{j(w3)t}\})$ contributes the term $6|S_2|^2 S_3 \cdot e^{j(w3)t}$ in frequency band C and the term $3S_2^2 S_3^* \cdot e^{j(2w2-w3)t}$ in frequency band 2B-C, and $3(\text{Re}\{S_2 \cdot e^{j(w2)t}\})(\text{Re}\{S_3 \cdot e^{j(w3)t}\})^2$ contributes the term $6S_2|S_3|^2 \cdot e^{j(w2)t}$ in frequency band B and the term $3S_2^* S_3^2 \cdot e^{j(-w2+2w3)t}$ in frequency band 2C-B.

The expansion of the cross term 6abc is new to the tri-band scenario as compared to the dual-band scenario. The expansion of this cross term can be represented as follows:

$$6 \cdot \text{Re}\{S_1 \cdot e^{j(w1)t}\} \cdot \text{Re}\{S_2 \cdot e^{j(w2)t}\} \cdot \text{Re}\{S_3 \cdot e^{j(w3)t}\} = \qquad (23)$$

$$6(S_1 \cdot e^{j(w1)t} + S_1^* \cdot e^{j(-w1)t})$$

$$(S_2 \cdot e^{j(w2)t} + S_2^* \cdot e^{j(-w2)t})(S_3 \cdot e^{j(w3)t} + S_3^* \cdot e^{j(-w3)t}) =$$

$$6S_1 S_2 S_3 \cdot e^{j(w1+w2+w3)t} + 6S_1 S_2 S_3^* \cdot e^{j(w1+w2-w3)t} +$$

$$6S_1 S_2^* S_3 \cdot e^{j(w1-w2+w3)t} + 6S_1(S_2 S_3)^* \cdot e^{j(w1-w2-w3)t} +$$

$$6S_1^* S_2 S_3 \cdot e^{j(-w1+w2+w3)t} + 6S_1^* S_2 S_3^* \cdot e^{j(-w1+w2-w3)t} +$$

$$6(S_1 S_2)^* S_3 \cdot e^{j(-w1-w2+w3)t} + 6(S_1 S_2 S_3)^* \cdot e^{j(-w1-w2-w3)t}.$$

From Equation (23), it can be seen that $6 \cdot \text{Re}\{S_1 \cdot e^{j(w1)t}\} \cdot \text{Re}\{S_2 \cdot e^{j(w2)t}\} \cdot \text{Re}\{S_3 \cdot e^{j(w3)t}\}$ contributes the terms $6S_1 S_2 S_3^* \cdot e^{j(w1+w2-w3)t}$, $6S_1 S_2^* S_3 \cdot e^{j(w1-w2+w3)t}$, and $6S_1^* S_2 S_3 \cdot e^{j(-w1+w2+w3)t}$ that, depending on the particular values for the carrier frequencies for the tri-band signal, may contribute to the distortion centered at one of the carrier frequencies of the tri-band signal.

Assuming $f_{c1} < f_{c3} < f_{c2}$ and there is no aliasing of the frequency components among all 12 bands, the results above for the tri-band signal are summarized below in Table 2.

TABLE 2

| Frequency Band | Terms |
| --- | --- |
| Band A (centered at $f_{c1}$) | $3S_1(|S_1|^2 + 2|S_2|^2 + 2|S_3|^2) \cdot e^{j(w1)t}$ |
| Band B (centered at $f_{c2}$) | $3S_2(2|S_1|^2 + |S_2|^2 + 2|S_3|^2) \cdot e^{j(w2)t}$ |
| Band C (centered at $f_{c3}$) | $3S_3(2|S_1|^2 + 2|S_2|^2 + |S_3|^2) \cdot e^{j(w3)t}$ |
| Band 2A-B (centered at $2f_{c1} - f_{c2}$) | $3S_1^2 S_2^* \cdot e^{j(2w1-w2)t}$ |
| Band 2B-A (centered at $2f_{c2} - f_{c1}$) | $3S_1^* S_2^2 \cdot e^{j(-w1+2w2)t}$ |
| Band 2A-C (centered at $2f_{c1} - f_{c3}$) | $3S_1^2 S_3^* \cdot e^{j(2w1-w3)t}$ |
| Band 2C-A (centered at $2f_{c3} - f_{c1}$) | $3S_1^* S_3^2 \cdot e^{j(-w1+2w3)t}$ |
| Band 2B-C (centered at $2f_{c2} - f_{c3}$) | $3S_2^2 S_3^* \cdot e^{j(2w2-w3)t}$ |
| Band 2C-B (centered at $2f_{c3} - f_{c2}$) | $3S_2^* S_3^2 \cdot e^{j(-w2+2w3)t}$ |
| Band BC-A (centered at $-f_{c1} + f_{c2} + f_{c3}$) | $6S_1^* S_2 S_3 \cdot e^{j(-w1+w2+w3)t}$ |
| Band AC-B (centered at $f_{c1} - f_{c2} + f_{c3}$) | $6S_1 S_2^* S_3 \cdot e^{j(w1-w2+w3)t}$ |
| Band AB-C (centered at $f_{c1} + f_{c2} - f_{c3}$) | $6S_1 S_2 S_3^* \cdot e^{j(w1+w2-w3)t}$ |

The results in Table 2 show that the signals in all 12 frequency bands of interest can be generated in baseband and then tuned to the center frequency of the corresponding frequency bands.

In one scenario, the carrier frequencies of the tri-band signal are located such that there is no aliasing of the frequency components among all 12 frequency bands. In this scenario, the predistortions in frequency bands A, B, and C need to be generated at baseband as:

$$\text{Band } A: S(|S_1|^2 + 2|S_2|^2 + 2|S_3|^2), \qquad (24)$$

$$\text{Band } B: S_2(2|S_1|^2 + |S_2|^2 + 2|S_3|^2), \text{ and} \qquad (25)$$

$$\text{Band } C: S_3(2|S_1|^2 + 2|S_2|^2 + |S_3|^2). \qquad (26)$$

These predistortions can be generated by configuring the permanent basis functions 26 of the predistorters 20 appropriately. For example, the predistorter 20 for frequency band A may include three permanent basis functions 26 configured as: $S_1|S_1|^2$, $2S_1|S_2|^2$, and $2S_1|S_3|^2$. In this scenario, no temporary basis functions 28 are needed since none of the terms in the predistortions for the frequency bands A, B, and C depend on carrier frequency information.

In another scenario, the carrier frequencies of the tri-band signal are located such that there is no aliasing of the frequency components among frequency bands A, B, and C, but due to the particular values of the carrier frequencies for the tri-band signal there is aliasing among other bands. Potentially, the following frequency bands could alias into frequency bands A, B, and C.

Band 2B-C could alias into band A,

Band 2C-A could alias into band B, and

Band AB-C could alias into band C.

In this case, following predistortions could potentially need to be generated for frequency bands A, B, and C depending on the values of the carrier frequencies of the tri-band signal.

$$\text{Band } A: S^1(|S_1|^2 + 2|S_2|^2 + 2|S_3|^2) + S_2^2 S_3^* \cdot e^{j(-w1+2w2-w3)t} \qquad (27)$$

$$\text{Band } B: S_2(2|S_1|^2 + |S_2|^2 + 2|S_3|^2) + S_1^* S_3^2 \cdot e^{j(-w1-w2+w3)t}, \text{ and} \qquad (28)$$

$$\text{Band } C: S_3(2|S_1|^2 + 2|S_2|^2 + |S_3|^2) + 2S_1 S_2 S_3^* \cdot e^{j(w1+w2-2w3)t}. \qquad (29)$$

Note that in each of the Equations (27) through (29) above, a negative frequency component was added to cancel the corresponding upconversion. For example, in Equation (27) for frequency band A, a $-w1$ term was added. This $-w1$ term will essentially be cancelled after upconversion for frequency band A such that the generated predistortion will be centered at the appropriate frequency, which in this case is $2f_{c2} - f_{c3}$.

Equations (27) through (29) show that carrier frequency information is needed for predistortion for the tri-band, third-order scenario.

In this scenario, the permanent basis functions 26 and the temporary basis functions 28 for the predistorters 20 for frequency bands A, B, and C are configured according to Equations (27) through (29). Using frequency band A as an example, the predistorter 20 for frequency band A may include three permanent basis functions 26 configured as: $S_1|S_1|^2$, $2S_1|S_2|^2$, and $2S_1|S_3|^2$. In addition, the predistorter 20 for frequency band A may include one temporary basis function 28 configured as $S_2{}^2 S^*_3 \cdot e^{j(-w1+2w2-w3)t}$.

In operation, regardless of the values of the carrier frequencies for the tri-band signal, the permanent basis functions 26 of the predistorters 20 are configured according to Equations (24) through (26). However, for the temporary basis functions 28, the values of the carrier frequencies for the tri-band signal are used to determine whether the term $S_2{}^2 S^*_3 \cdot e^{j(-w1+2w2-w3)t}$ should be included as the temporary basis function 28 for band A, whether the term $S^*_1 S_3{}^2 \cdot e^{j(-w1-w2+2w3)t}$ should be included as the temporary basis function 28 for band B, and whether the term $2S_1 S_2 S^*_3 \cdot e^{j(w1+w2-2w3)t}$ should be included as the temporary basis function 28 for band C. The temporary basis functions 28 for band A, band B, and/or band C are then configured accordingly using the additional terms shown in Equations (27) through (29).

Generalized Process: Before proceeding a few notations for this discussion of the generalized process should be defined. The frequency bands with the lowest and highest carrier frequencies are referred to as frequency bands 1 and 2, respectively. The carrier frequencies of frequency bands 1 and 2 are denoted $f_{c\_1}$ and $f_{c\_2}$, respectively. The other frequency bands are referred to according to their carrier frequencies in ascending order and frequency bands 3, 4, . . . , M, respectively, have carrier frequencies $f_{c\_3}$, $f_{c\_m}$, . . . , $f_{c\_M}$, respectively.

Once steps 200 and 202 have been performed, steps 204 and 206 may be performed for any concurrent multi-band signal and any maximum order as follows. In order to determine the permanent basis functions, an expansion of a mathematical expression for a non-distorted version of the modulated concurrent multi-band signal passed through a (2k+1)th order non-linear function is obtained as follows. First, the modulated concurrent multi-band signal can be expressed as:

$$\left(\sum_{i=1}^{M} \text{Re}\{S_i \cdot e^{j(w\_i)t}\}\right)^{(2k+1)}, \quad (30)$$

where M is the number of frequency bands for the concurrent multi-band signal, $S_i$ is the i-th baseband signal corresponding to the i-th frequency band of the concurrent multi-band signal, $w\_i$ is equal to $2\pi f_{c\_i}$ where $f_{c\_i}$ is the center frequency of the i-th frequency band of the concurrent multi-band signal, and (2k+1) is the maximum order. Note that Equation (30) represents a non-distorted version of the modulated concurrent multi-band signal passed through a (2k+1)th order non-linear function.

Equation (30) can then be expanded as follows:

$$\left(\sum_{i=1}^{M} \text{Re}\{S_i \cdot e^{j(w\_i)t}\}\right)^{(2k+1)} = \left(\sum_{i=1}^{M} (S_i \cdot e^{j(w\_i)t}) + (S_i^* \cdot e^{-j(w\_i)t})\right)^{(2k+1)} \quad (31)$$

$$= \sum_{q=1}^{Q} C_q \left(\prod_{i=1}^{M} (S_i \cdot e^{j(w\_i)t})^{(p\_o(q,i))} \right. \quad (32)$$

$$\left. (S_i^* \cdot e^{j(w\_i)t})^{(p\_c(q,i))}\right),$$

where Q is known number of terms in the expansion of the sum of M terms to the (2k+1)th order, $C_q$ is a coefficient of the q-th term in the expansion that can be obtained using known combination theory, p_o(q,i) is the order of the q-th term for the i-th band of the original signal of the complex representation of the multi-band signal, and p_c is the order of the q-th term for the i-th band of the conjugate signal of the complex representation of the concurrent multi-band signal. For every term q, the sum of p_o(q,i) and p_c(q,i) for all values of i is equal to (2k+1), that is:

$$\sum_{i=1}^{M} (\text{p\_o}(q, i) + \text{p\_c}(q, i)) = (2k + 1).$$

To obtain an expression for the coefficient $C_q$, first define that p_o(q,0)=p_c(q,0)=0, then $C_q$ can be expressed as:

$$C_q = \prod_{i=1}^{M} \left(\text{n\_chose\_k}\left(2k + 1 - \sum_{j=0}^{i-1} (\text{p\_o}(q, j) + \text{p\_c}(q, j)), \text{p\_o}(q, i)\right)\right) \times$$

$$\prod_{i=1}^{M} \left(\text{n\_chose\_k} \right.$$

$$\left. \left(2k + 1 - \sum_{j=0}^{i-1} (\text{p\_o}(q, j) + \text{p\_c}(q, j)) - \text{p\_o}(q, i), \text{p\_c}(q, i)\right)\right).$$

It should be noted that, in Equation (32), the terms Q, $C_q$, p_c(q,i), and p_o(q,i) are all specific to the order (2k+1).

Based on Equation (32), for each term q, the center frequency for term q can be defined as:

$$f_{t\_q} = \sum_{i=1}^{M} (\text{p\_o}(q, i) - \text{p\_c}(q, i)) f_{c\_i}, \quad (33)$$

where $f_{t\_c}$ is the center frequency for term q. Similarly, the frequency span, or bandwidth, for each term q can be defined as:

$$bw_{t\_q} = \sum_{i=1}^{M} (\text{p\_o}(q, i) + \text{p\_c}(q, i)) bw_i, \quad (34)$$

where $bw_{t\_q}$ is the frequency span, or bandwidth, of term q and $bw_i$ is the frequency span, or bandwidth, of the i-th frequency band of the concurrent multi-band signal. The frequency components for term q span the frequency range of $[f_{t\_q} - (1/2)bw_{t\_q}, f_{t\_q} + (1/2)bw_{t\_q}]$.

The permanent basis functions 26 are basis functions for terms in the expansion defined by Equation (32) of the form $f_{t\_q}=f_{c\_i}$ for any i. In other words, the permanent basis functions 26 are basis functions for terms in the expansion defined by Equation (32) whose center frequencies ($f_{t\_q}$) are equal to the carrier frequency ($f_{c\_i}$) of any one of the frequency bands of the concurrent multi-band signal regardless of the actual values of the carrier frequencies of the concurrent multi-band signal. This can be expressed as the constraints that:

$p\_o(q,j)=p\_c(q,j)+1$ for a particular band $j$, and $p\_o(q,h)=p\_c(q,h)$ for all other bands $h \neq j$, where j and h belong to $\{1, 2, \ldots M\}$. These terms are referred to herein as type 1 terms.

For a type 1 term with index q, the term can be expressed as:

$$C_q \left( \prod_{i=1}^{M} (S_i \cdot e^{j(w\_i)t})^{(p\_o(q,i))} (S_i^* \cdot e^{j(w\_i)t})^{(p\_c(q,i))} \right) = \quad (35)$$

$$C_q \left( \prod_{i=1}^{M} \left( ((S_i)^{(p\_o(q,i))} (S_i^*)^{(p\_c(q,ik))}) \cdot (e^{j(w\_i)t})^{(p\_o(q,i))} \cdot (e^{j(w\_i)t})^{(p\_c(q,i))} \right) \right) = \quad (36)$$

$$C_q \left( \prod_{i=1}^{M} ((S_i)^{(p\_o(q,i))} (S_i^*)^{(p\_c(q,i))}) \cdot (e^{j(w\_j)t}) \right). \quad (37)$$

Note that in Equation (37), the term is centered at carrier frequency $f_{c\_j}$. Together with the image, each type 1 term can be expressed as:

$$\mathrm{Re}\left\{ C_q \left( \prod_{i=1}^{M} ((S_i)^{(p\_o(q,i))} (S_i^*)^{(p\_c(q,i))}) \cdot (e^{j(w\_j)t}) \right) \right\}. \quad (38)$$

From Equation (38), it is clear that the corresponding permanent basis function 26 for the type 1 term q for frequency band j is:

$$C_q \left( \prod_{i=1}^{M} ((S_i)^{(p\_o(q,i))} (S_i^*)^{(p\_c(q,i))}) \right). \quad (39)$$

Notably, the basis functions for the type 1 terms as defined by Equation (39) are a function of the baseband signals $S_i$ for the corresponding frequency bands of the concurrent multi-band signal and are not a function of the actual values of the carrier frequencies. For this reason, these basis functions are referred to herein as the permanent basis functions 26.

It should be noted that while the process above for determining the permanent basis functions 26 is discussed for the maximum order (2k+1), it should be noted that this process is preferably repeated for all odd orders up to the maximum order (2k+1). In this manner, an exhaustive search for type 1 terms is performed for all odd order expansions starting with the third-order and up to the maximum order (2k+1). Baseband representations of the identified type 1 terms correspond to the permanent basis functions 26 for the predistorters 20 for corresponding frequency bands of the concurrent multi-band signal.

In order to determine the temporary basis functions 28, the frequency span of the frequency components in the distortions centered at each of the carrier frequencies ($f_{c\_i}$) of the concurrent multi-band signal is determined. Let $bw_{c\_i\_IM(2k+1)\_max}$ denote the span of frequency components in the distortion centered at $f_{c\_i}$, where $bw_{c\_i\_IM(2k+1)\_max}$ can be obtained as a maximum frequency span for a set of terms denoted as $T_{c\_i\_IM(2k+1)}$. The terms in the set $T_{c\_i\_IM(2k+1)}$ are type 1 terms centered at $f_{c\_i}$ obtained from the expansion of the expression of the (2k+1)th power of the multi-band signal as expressed in Equation (30). Based on the above, it follows that:

$$bw_{c\_i\_IM(2k+1)\_max} = \max_{t\_q \in T_{c\_i\_IM(2k+1)}} (bw_{t\_q}).$$

Every particular type 1 term belongs to one and only one set $T_{c\_i\_IM(2k+1)}$. Based on the above, the distortion of the permanent basis functions 26 as a result of up to the (2k+1)th order non-linearities centered at $f_{c\_i}$ span the frequency range $[f_{c\_i}-(1/2)bw_{c\_i\_IM(2k+1)\_max}, f_{c\_i}+(1/2)bw_{c\_i\_IM(2k+1)\_max}]$. The frequency range is referred to herein as the range of the distortion by the permanent basis functions 26 in the band centered at $f_{c\_i}$.

The temporary basis functions 28 are determined by performing an exhaustive search of all type 2 terms in the expansion of all even and odd orders starting with the second order and up to the maximum order (2k+1) of the modulated concurrent multi-band signal. It should be noted that, in the single-band case, no terms from the expansion of even order powers (2k) of the modulated concurrent multi-band signal will have a center frequency at the carrier frequency of the single-band signal. As such, for a single-band signal, even order terms are usually not considered for distortion and predistortion. In contrast, for the concurrent multi-band signal case, there are certain sets of carrier frequency values for which there could be terms from the even order expansions that contribute to the distortion centered at the carrier frequencies of the concurrent multi-band signal. For this reason, the expansion of even order terms should also be considered.

As discussed above, type 1 terms are those terms q where the expression, not only the value, of $f_{t\_q}=f_{c\_i}$, which is independent of the actual carrier frequencies. In contrast, as used herein, type 2 terms are all non-type 1 terms. Type 2 terms could have a center frequency of $f_{t\_q}=f_{c\_i}$ in terms of actual value for certain systems with specific values of the carrier frequencies. Thus, type 2 terms are terms that can be expressed as $f_{t\_q} \neq f_{c\_i}$, but where actual values for $f_{t\_q}$ and $f_{c\_i}$ may be equal for particular values of the carrier frequencies. Odd order expansions include both type 1 and type 2 terms. In contrast, even order expansions include only type 2 terms. The temporary basis functions 28 are determined by performing an exhaustive search of all type 2 terms in all even and odd order expansions up to the maximum order (2k+1) of the modulated concurrent multi-band signal. More specifically, each type 2 term of index t_q from the expansion of the p-th order expression for the modulated concurrent multi-band signal spans the frequency range $[f_{t\_q}-(\frac{1}{2})bw_{t\_q}, f_{t\_q}+(\frac{1}{2})bw_{t\_q}]$ (i.e., the frequency span, or bandwidth, of the type 2 term is $[f_{t\_q}-(\frac{1}{2})bw_{t\_q}, f_{t\_q}+(\frac{1}{2})bw_{t\_q}]$).

For each type 2 term, the corresponding frequency span of the type 2 term for the actual values of the carrier frequencies ($f_{c\_i}$) for the concurrent multi-band signal is compared to the range of distortion by the permanent basis functions 26 in each of the frequency bands of the concurrent multi-band signal. If an overlap is found between the frequency span of a type 2 term and the range of distortion by the permanent basis function 26 for frequency band i, then that type 2 terms is determined to be a temporary basis function 28 for the predistorter 20 for frequency band i. Each of the type 2 terms identified for the temporary basis functions 28 can be expressed as:

$$C_q\left(\prod_{i=1}^{M} ((S_i)^{(p\_o(q,i))}(S_i^*)^{(p\_c(q,i))}) \cdot (e^{j(w\_t\_q)t})\right) = \quad (40)$$

$$C_q\left(\prod_{i=1}^{M} ((S_i)^{(p\_o(q,i))}(S_i^*)^{(p\_c(q,i))}) \cdot (e^{j(w\_t\_q-w\_j)t}) \cdot (e^{j(w\_j)t})\right), \quad (41)$$

where $w\_t\_q=2\pi f_{t\_q}$. Note that the type 2 term of Equation (41) can be considered as centering at carrier frequency $f_{c\_j}$. Together with the image, the type 2 terms identified for the temporary basis functions 28 can be expressed as:

$$\text{Re}\left\{C_q\left(\prod_{i=1}^{M} ((S_i)^{(p\_o(q,i))}(S_i^*)^{(p\_c(q,i))}) \cdot (e^{j(w\_t\_q-w\_j)t}) \cdot (e^{j(w\_j)t})\right)\right\}. \quad (42)$$

From Equation (42), it is clear that the corresponding temporary basis function 28 is:

$$C_q\left(\prod_{i=1}^{M} ((S_i)^{(p\_o(q,i))}(S_i^*)^{(p\_c(q,i))}) \cdot (e^{j(w\_t\_q-w\_j)t})\right),$$

where $e^{j(w\_t\_q-w\_j)t}$ is a baseband tuning, and $w\_t\_q-w\_j$ is referred to herein as a baseband tuning frequency for the temporary basis function 28.

After the exhaustive search for type 2 terms having frequency spans that overlap the range of distortion by the permanent basis functions 26 in each of the frequency bands of the concurrent multi-band signal is complete, all of the temporary basis functions 28 have been determined. It should be noted that the type 2 terms may be pre-screened to reduce the number of type 2 terms that need to be searched. More specifically, some type 2 terms will never serve as temporary basis functions 28 regardless of the values of the carrier frequencies of the concurrent multi-band signal and, therefore, can be excluded from the search. For example, if the center frequency $f_{t\_q}$ for a type 2 term q will always be less than zero, then that type 2 term can be excluded from the search. Other techniques may be used to reduce the number of type 2 terms for the search and should be considered within the scope of this disclosure.

The following acronyms are used throughout this disclosure.

ASIC Application Specific Integrated Circuit
CDMA Code Division Multiple Access
DSP Digital Signal Processor
IC Integrated Circuit
IM3 Third-Order Intermodulation Distortion
IM5 Fifth-Order Intermodulation Distortion
OFDM Orthogonal Frequency Division Multiplexing
PA Power Amplifier
PBF Permanent Base Function
PD Predistorter
QAM Quadrature Amplitude Modulation
TBF Temporary Base Function Those skilled in the art will recognize improvements and modifications to the preferred embodiments of the present disclosure. All such improvements and modifications are considered within the scope of the concepts disclosed herein and the claims that follow.

What is claimed is:

1. A transmitter comprising:
a power amplifier configured to amplify a modulated concurrent multi-band signal to provide an amplified concurrent multi-band signal; and
a predistortion sub-system configured to effect predistortion of the modulated concurrent multi-band signal to compensate for a non-linearity of the power amplifier, where the predistortion sub-system comprises a plurality of predistorters each configured to provide predistortion for a different one of a plurality of frequency bands of the modulated concurrent multi-band signal;
where at least one predistorter of the plurality of predistorters provides predistortion for a corresponding frequency band of the plurality of frequency bands of the modulated concurrent multi-band signal based on carrier frequency information for the modulated concurrent multi-band signal; and
where the at least one predistorter of the plurality of predistorters comprises one or more permanent basis functions that are not a function of the carrier frequency information and one or more temporary basis functions that are a function of the carrier frequency information.

2. The transmitter of claim 1 wherein the modulated concurrent multi-band signal comprises frequency components in the plurality of frequency bands with no frequency components between any adjacent frequency bands of the plurality of frequency bands.

3. The transmitter of claim 2 wherein the carrier frequency information comprises values for a plurality of carrier frequencies of the modulated concurrent multi-band signal, and the plurality of carrier frequencies are center frequencies of the plurality of frequency bands of the modulated concurrent multi-band signal.

4. The transmitter of claim 1 wherein the plurality of predistorters are configured to process a plurality of baseband input signals corresponding to the plurality of frequency bands of the modulated concurrent multi-band signal to provide a corresponding plurality of predistorted baseband signals for the plurality of frequency bands of the modulated concurrent multi-band signal.

5. The transmitter of claim 4 further comprising an upconversion and modulation sub-system configured to upconvert, modulate, and combine the plurality of predistorted baseband signals from the plurality of predistorters to provide the modulated concurrent multi-band signal having predistortion effected by the predistortion sub-system.

6. The transmitter of claim 4 wherein each predistorter of the plurality of predistorters is configured to process at least a subset of the plurality of baseband input signals to provide a corresponding one of the plurality of predistorted baseband signals for a corresponding one of the plurality of frequency bands of the modulated concurrent multi-band signal.

7. The transmitter of claim 6 wherein the at least one predistorter of the plurality of predistorters is configured to process the at least a subset of the plurality of baseband input signals based on the carrier frequency information to provide the corresponding one of the plurality of predistorted baseband signals for the corresponding one of the plurality of frequency bands of the modulated concurrent multi-band signal.

8. The transmitter of claim 1 wherein, for each predistorter of the at least one predistorter, each permanent basis function of the one or more permanent basis functions corresponds to a term in an expansion of an odd order up to a maximum order (2k+1) of an expression for a non-distorted version of the modulated concurrent multi-band signal that has a center frequency that is equal to one of a plurality of carrier frequencies of the modulated concurrent multi-band signal for the corresponding frequency band of the modulated concurrent multi-band signal for which the predistorter provides predistortion.

9. The transmitter of claim 8 wherein, for each predistorter of the at least one predistorter, each temporary basis function of the one or more temporary basis functions corresponds to a term in an expansion of an even or odd order up to a maximum order (2k+1) of an expression for a non-distorted version of the modulated concurrent multi-band signal that has a frequency span determined based on actual values of the plurality of carrier frequencies that overlaps a frequency range of distortion by the one or more permanent basis functions for the corresponding frequency band for which the predistorter provides predistortion.

10. A method of operation of a transmitter comprising:
amplifying, via a power amplifier of the transmitter, a modulated concurrent multi-band signal to provide an amplified concurrent multi-band signal; and
prior to amplifying, effecting predistortion of the modulated concurrent multi-band signal to compensate for a non-linearity of the power amplifier of the transmitter via a plurality of predistorters each configured to provide predistortion for a different one of a plurality of frequency bands of the modulated concurrent multi-band signal;
where at least one predistorter of the plurality of predistorters provides predistortion for a corresponding frequency band of the plurality of frequency bands of the modulated concurrent multi-band signal based on carrier frequency information for the modulated concurrent multi-band signal; and
where effecting predistortion of the modulated concurrent multi-band signal further comprises, for the at least one predistorter:
receiving a plurality of baseband input signals that correspond to the plurality of frequency bands of the modulated concurrent multi-band signal;
processing at least a subset of the plurality of baseband input signals based on one or more permanent basis functions of the predistorter to provide one or more permanent basis function output signals;
processing at least a subset of the plurality of baseband input signals based on one or more temporary basis functions of the predistorter and the carrier frequency information to provide one or more temporary basis function output signals; and
combining the one or more permanent basis function output signals and the one or more temporary basis function output signals to provide a predistorted output signal for the corresponding frequency band of the modulated concurrent multi-band signal for which the predistorter provides predistortion.

11. The method of claim 10 wherein the modulated concurrent multi-band signal comprises frequency components in the plurality of frequency bands with no frequency components between any adjacent frequency bands of the plurality of frequency bands.

12. The method of claim 11 wherein the carrier frequency information comprises values for a plurality of carrier frequencies of the modulated concurrent multi-band signal, and the plurality of carrier frequencies are center frequencies of the plurality of frequency bands of the modulated concurrent multi-band signal.

13. The method of claim 10 further comprising upconverting, modulating, and combining the plurality of predistorted baseband signals from the plurality of predistorters to provide the modulated concurrent multi-band signal.

14. The method of claim 10 wherein, for each predistorter of the at least one predistorter, each permanent basis function of the one or more permanent basis functions corresponds to a term in an expansion of an odd order up to a maximum order (2k+1) of an expression for a non-distorted version of the modulated concurrent multi-band signal that has a center frequency that is equal to one of a plurality of carrier frequencies of the modulated concurrent multi-band signal for the corresponding frequency band of the modulated concurrent multi-band signal for which the predistorter provides predistortion.

15. The method of claim 14 wherein, for each predistorter of the at least one predistorter, each temporary basis function of the one or more temporary basis functions corresponds to a term in an expansion of an even or odd order up to a maximum order (2k+1) of an expression for a non-distorted version of the modulated concurrent multi-band signal that has a frequency span determined based on actual values of the plurality of carrier frequencies that overlaps a frequency range of distortion by the one or more permanent basis functions for the corresponding frequency band for which the predistorter provides predistortion.

16. A method configuring a plurality of predistorters to effect predistortion of a concurrent multi-band signal to compensate for a non-linearity of a power amplifier in a transmitter, wherein configuring at least one predistorter of the plurality of predistorters comprises:
determining one or more permanent basis functions for the predistorter that are not a function of carrier frequency information for the concurrent multi-band signal;
wherein determining the one or more permanent basis functions comprises:
identifying terms in an expansion of odd orders up to a maximum order of an expression for the concurrent multi-band signal that have center frequencies that are equal to a carrier frequency for one of a plurality of frequency bands of the concurrent multi-band signal for which the predistorter provides predistortion; and
obtaining the one or more permanent basis functions from the terms identified as having center frequencies that are equal to the carrier frequency for the one of the plurality of frequency bands of the concurrent multi-band signal for which the predistorter provides predistortion;
determining one or more temporary basis functions for the predistorter that are a function of the carrier frequency information for the concurrent multi-band signal; and configuring the predistorter with the one or more permanent basis functions and the one or more temporary basis functions.

17. The method of claim 16 wherein, for each predistorter of the plurality of predistorters, determining the one or more temporary basis functions comprises:

identifying terms in an expansion of even and odd orders up to a maximum order of an expression for the concurrent multi-band signal that have frequency spans that overlap a frequency range of distortion by the one or more permanent basis functions for a corresponding frequency band for which the predistorter provides predistortion; and obtaining the one or more temporary basis functions from the terms identified as having center frequencies that have frequency spans that overlap a frequency range of distortion by the one or more permanent basis functions for a corresponding frequency band for which the predistorter provides predistortion.

* * * * *